United States Patent [19]

Hiruta

[11] Patent Number: 5,424,917

[45] Date of Patent: Jun. 13, 1995

[54] SEMICONDUCTOR DEVICE AND METHOD FOR MOUNTING SEMICONDUCTOR WAFER

[75] Inventor: Yoichi Hiruta, Matsudo, Japan

[73] Assignee: Kabushiki Kaisha Toshiba, Kawasaki, Japan

[21] Appl. No.: 165,492

[22] Filed: Dec. 13, 1993

Related U.S. Application Data

[63] Continuation of Ser. No. 791,174, Nov. 13, 1991.

[30] Foreign Application Priority Data

Nov. 13, 1990 [JP] Japan ................... 2-306448

[51] Int. Cl.6 .............................................. H05K 7/20
[52] U.S. Cl. .................... 361/699; 361/688;
361/711; 361/752; 361/796; 174/15.2; 174/252;
257/720; 257/675
[58] Field of Search ............... 361/679, 688, 689, 696,
361/699, 703, 704, 711, 736, 748, 752, 796;
257/675, 720; 174/15.1, 15.2, 16.2, 16.3, 17 R,
17 LF, 252

[56] References Cited

U.S. PATENT DOCUMENTS

| | | | |
|---|---|---|---|
| 4,479,088 | 10/1984 | Stopper | 324/73 R |
| 4,697,858 | 10/1987 | Balakrishnan | 439/61 |
| 4,734,825 | 3/1988 | Peterson | 361/414 |
| 4,849,858 | 7/1989 | Grapes . | |
| 4,872,088 | 10/1989 | Hawkins | 361/384 |
| 4,971,570 | 11/1990 | Tolle . | |
| 5,051,865 | 9/1991 | Kato . | |
| 5,091,822 | 2/1992 | Takashima | 361/384 |
| 5,119,273 | 6/1992 | Corda . | |
| 5,191,224 | 3/1993 | Tazunoki et al. | 257/724 |

FOREIGN PATENT DOCUMENTS

| | | |
|---|---|---|
| 59-15400 | 4/1984 | Japan . |
| 61-32454 | 2/1986 | Japan . |
| 62-293750 | 12/1987 | Japan . |

OTHER PUBLICATIONS

Yamada, et al., *Nikkei Microdevices*, "Neural Network Neurotip Wafer", Dec. 1989, pp. 99–105.

Primary Examiner—Leo P. Picard
Assistant Examiner—Young Whang
Attorney, Agent, or Firm—Foley & Lardner

[57] ABSTRACT

A semiconductor device comprises a printed circuit board with circuit pattern formed thereon, and a semiconductor wafer having terminals installed on its peripheral portion. Semiconductor chips are mounted on one surface or both surfaces of the semiconductor wafer. A connector is installed on the printed circuit board for electrical connection with the terminals. When the terminals are connected to the circuit pattern, the semiconductor wafer is installed substantially vertically on the printed circuit board. Or a semiconductor wafer member is constituted by two semiconductor wafers, and a closed space is internally formed between the two wafers and heat pipes for heat radiation are inserted in the closed space.

13 Claims, 6 Drawing Sheets

SEMICONDUCTOR DEVICE AND METHOD FOR MOUNTING SEMICONDUCTOR WAFER

This application is a Continuation of application Ser. No. 07/791,174, filed Nov. 13, 1991.

BACKGROUND OF THE INVENTION

The present invention relates to a semiconductor device including a semiconductor wafer and method for mounting a semiconductor wafer.

Figure 13:
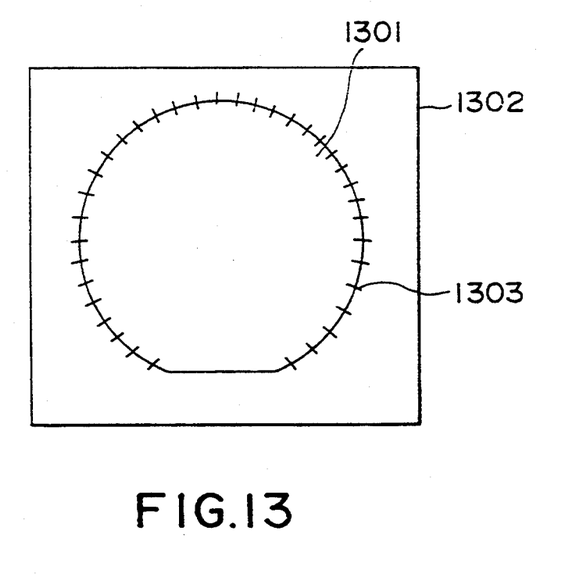
FIG. 13 is a plan view showing the structure of a semiconductor device in the prior art.

A semiconductor device includes a semiconductor wafer with a circuit pattern formed thereon which is mounted on a printed circuit board. Such a semiconductor device in the prior art is shown in FIG. 13. A semiconductor wafer 1301 is mounted horizontally on a printed circuit board 1302, and respective terminals of the wafer and board are connected to each other by a bonding wires 1303. A device using such a mounting-,method is also disclosed in Nikkei micro device (December 1989) pp. 99-105.

In a semiconductor device of the prior art, however, a problem exists in that since a semiconductor wafer is mounted horizontally on a printed circuit board, the mounting area is extremely large. Also, since the terminal connection between the semiconductor wafer and the printed circuit board are carried out by bonding wires, time is required for bonding and execution of the bonding itself is difficult for a large-size semiconductor wafer.

Further, in a device mounting such semiconductor wafer on a printed circuit board, power consumption becomes excessive and radiation becomes a problem. Since the semiconductor wafer is mounted horizontally on the printed circuit board in the prior art, the radiation property is poor and there is the possibility of adversely affecting the electric property.

SUMMARY OF THE INVENTION

In view of the above problems, an object of the present invention is to provide a semiconductor device including a semiconductor wafer and a method for mounting a semiconductor wafer, where the mounting area is reduced, high density mounting becomes possible, time is not wasted for connections between the semiconductor wafer and the printed circuit board, and further the radiation property is improved.

According to the present invention, a semiconductor device is provided which comprises a printed circuit board, with a circuit pattern formed thereon, and a semiconductor wafer having a terminal installed a peripheral portion thereof and being mounted substantially vertically on the printed circuit board with the terminal electrically connected to the circuit pattern of the printed circuit board.

Since the semiconductor wafer is mounted substantially vertically on the printed circuit board, the mounting density is improved and the radiation property is better in comparison to the horizontally mounted state.

A semiconductor chip may be mounted on one surface or both surfaces of the semiconductor wafer, and also in this case, the mounting density and the radiation property are improved. When the semiconductor chip is mounted on both surfaces, the location of terminals on both surfaces of the peripheral portion of the semiconductor wafer further improves the mounting density.

When a connector is installed on the printed circuit board and the peripheral portion with a terminal of the semiconductor wafer installed thereon is fitted to this connector, electrical connection between the semiconductor wafer and the printed circuit board becomes easier and the mounting time can be reduced.

A bus line formed on the semiconductor wafer comprises main bus lines and branch bus lines, and when the main bus lines are connected to the terminal through an input/output chip, signal processing can be carried out more efficiently and loss and delay of the signal transmission can be suppressed.

A cooling medium flows (e.g. fluorocarbon) flows in or out through a spacer and a connector, between a space internally formed in the semiconductor wafer member with two semiconductor wafers opposed and piping of the printed circuit board, thereby the semiconductor wafer is forcibly cooled and the radiation property is improved.

When the semiconductor chip is mounted at the inside surface with semiconductor wafers opposed, since the chip is cooled directly by the cooling medium, the radiation property is further improved.

When a heat pipe is installed between the two opposite semiconductor wafers and a radiating fin is installed on the end of the heat pipe, heat generated by the semiconductor wafer is transmitted efficiently to the end by the heat pipe and radiated from the radiating fin thereby the radiation property is excellent.

If the outside shape of the semiconductor wafer is rectangular, when the semiconductor chip is mounted on the semiconductor wafer, there is less waste space and the mounting density is improved.

If a reinforcing plate is installed on a portion of the surface of the semiconductor wafer and not having other parts mounted, the strength of the semiconductor wafer is increased.

Such a semiconductor device can be manufactured by a package method for the semiconductor wafer of the present invention so that the above-mentioned function achieved.

BRIEF DESCRIPTION OF THE DRAWINGS

In the attached drawings.

DESCRIPTION OF THE PREFERRED EMBODIMENTS

An embodiment of the present invention will be described, with reference to the accompanying drawings.

Figure 1A:
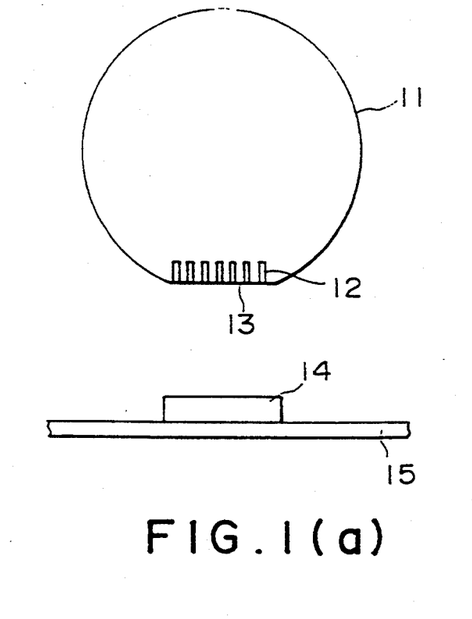
FIG. 1 provides a front view and a side view showing the structure of a semiconductor device according to a first embodiment of the invention.

FIG. 1(a) shows the structure of a semiconductor device according to a first embodiment. In this embodiment, a circuit pattern is formed on a semiconductor wafer 11, without semiconductor chip parts comprising a WSI (wafer scale integration) element. Such a structure is characterized in that the semiconductor wafer 11 is mounted vertically on a printed circuit board 15. A flat oriented portion 13 at a peripheral portion of the semiconductor wafer 11 is provided with terminals 12 for connection with the printed circuit board 15. The terminals 12 include a power source terminal for supplying power, a signal input/output terminal for inputting or outputting signals, and the like. Formation of the terminals 12 may be carried out together during the step of forming a metal wiring layer during manufacture of the semiconductor wafer 11.

The terminals 12 are fitted into a connector 14 mounted on the printed circuit board 15, thereby mounting the semiconductor wafer 11. In this case, the connector 14 functions as a fixture for fixing the semiconductor wafer 11 to the printed circuit board 15, and also functions to connect both members electrically. However, the semiconductor wafer 11 may be fixed onto the printed circuit board 15 using any fixing part, and the terminals 12 may be connected to the printed circuit board 15 by means of soldering or the like.

Figure 1B:
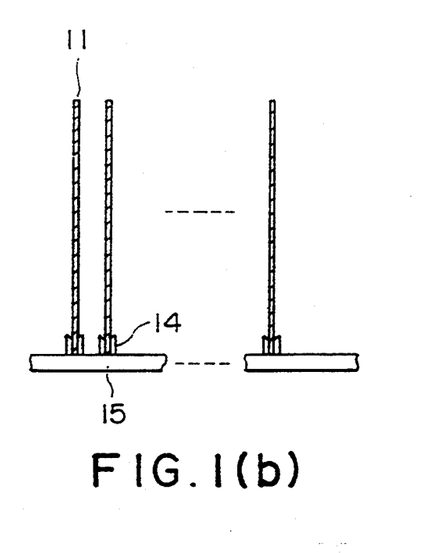

FIG. 1(b) is a right side view when the semiconductor wafer 11 is mounted on the printed circuit board 15. As shown in the figure, a plurality of connectors 14 can be mounted on the printed circuit board 15, and a plurality of semiconductor wafers 11 can be fitted and mounted. According to this embodiment, since the package area is reduced, in comparison to the device in the prior art shown in FIG. 13, even when the printed circuit board 15 of the same area is used, a plurality of semiconductor wafers 11 can be mounted, thereby improving the package density. Also, since the semiconductor wafer 11 is mounted vertically, the radiation property is good.

Figure 2A:
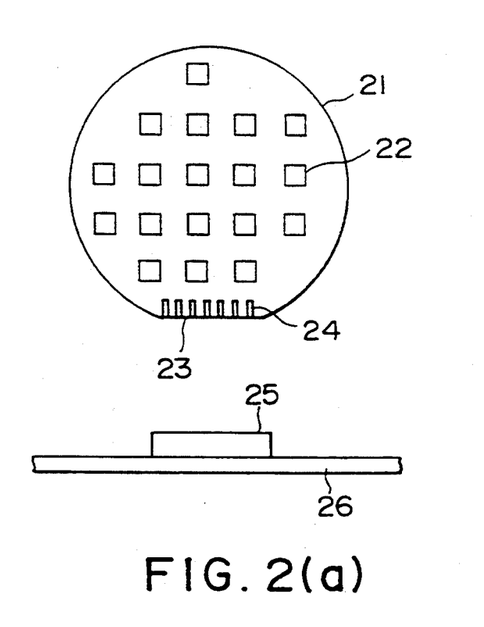
FIG. 2 provides a front view and a side view showing the structure of a semiconductor device according to a second embodiment of the invention.
Figure 2B:
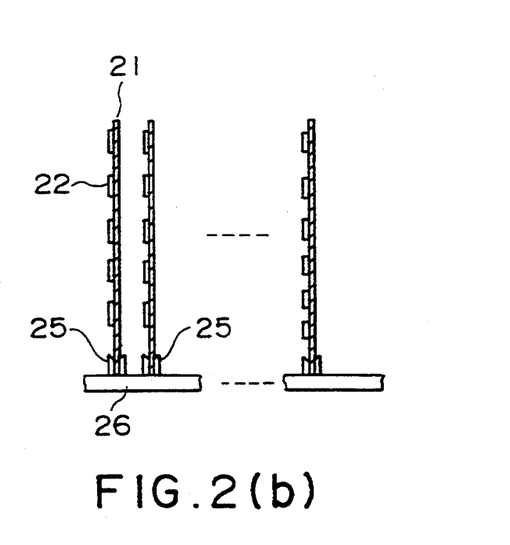

FIG. 2 shows structure of a semiconductor device according to a second embodiment of the present invention. In this embodiment, semiconductor chip parts 22 are mounted on a semiconductor wafer 21 with a wiring pattern formed thereon. The semiconductor wafer 21 and the semiconductor chips 22 are connected by soldering or bonding wires, and can be manufactured using the chip-on-wafer (hereinafter referred to as "COW") technology.

Terminals 24 are also formed on a flat, oriented portion 23 of the semiconductor wafer 21, The terminals 24 are formed simultaneously during the step of forming a wiring layer connected to the semiconductor chip parts 22 on the semiconductor wafer 21, and thereby the number of processes can be reduced.

Figure 3:
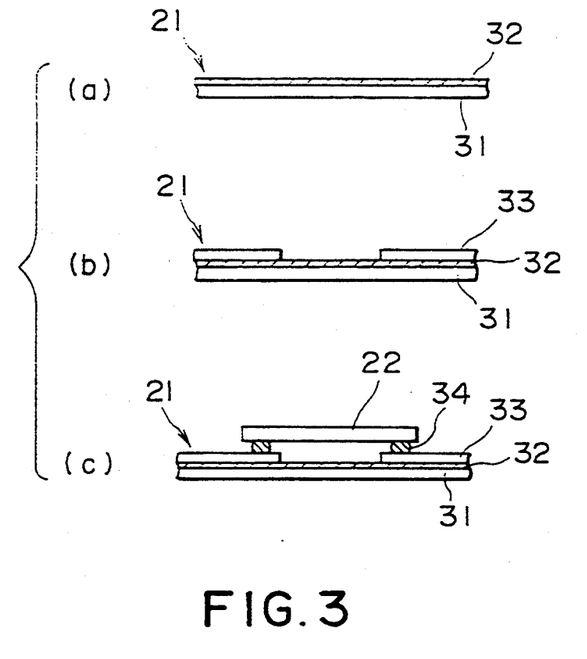
FIG. 3 is a longitudinal sectional view showing a method of manufacturing the semiconductor device in steps.

FIG. 3 shows the process of mounting the semiconductor chip part 22 onto the semiconductor wafer 21 by the COW technology. First, as shown in FIG. 3(a), an insulation layer 32 is on surface of a semiconductor substrate 31. As shown in FIG. 3(b), a wiring layer 33 is formed at a desired location on the surface of the insulation layer 32. As shown in FIG. 3(c), the wiring layer 33 and electrode of the semiconductor chip 22 are mounted on the semiconductor wafer 21 in the state when they are electrically connected by a bump 34.

Figure 4:
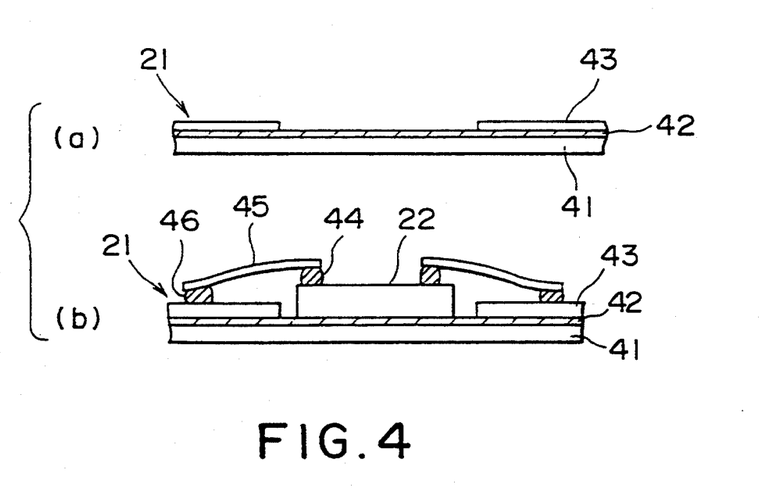
FIG. 4 is a longitudinal sectional view showing another method of manufacturing the semiconductor device in steps.

Also as shown in FIG. 4, the semiconductor chip 22 can be mounted using a tape automatic bonding (TAB) method. As shown in FIG. 4(a), first, a wiring layer 43 is formed on a semiconductor substrate 41 over an insulation film 42. And then, as shown in FIG. 4(b), a lead 45 formed on tape and an electrode of the semiconductor chip 22 are connected by a bump 44, and the lead 45 and a wiring layer 43 are connected by a bump 46. When the TAB method is used, all semiconductor chips 22 can be mounted at the same time on the semiconductor wafer 21, thereby high production efficiency can be obtained.

Figure 5A:
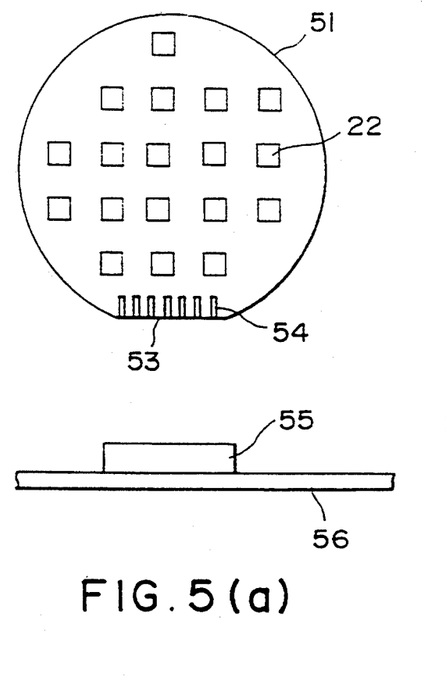
FIG. 5 provides a front view and a side view showing the structure of a semiconductor device according to a third embodiment of the invention.
Figure 5B:
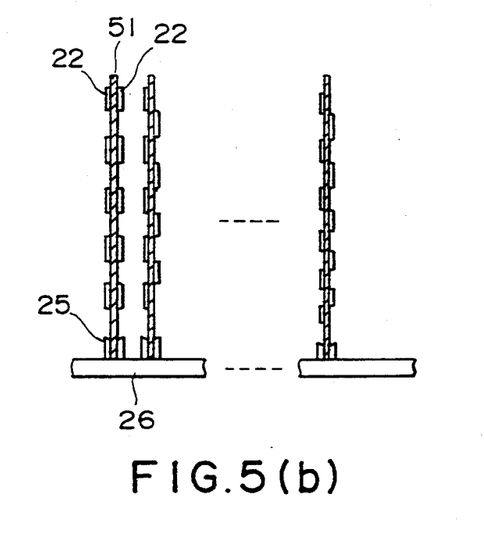

A semiconductor device according to a third embodiment of the present invention has structure shown in FIG. 5(a) as a plan view and in FIG. 5(b) as a right side view in its package state. The semiconductor chips 22 are mounted on both surfaces of a semiconductor wafer 51. Terminals 54 are formed on both surfaces at an flat, oriented portion 53 of the semiconductor wafer 51. The terminals 54 are fitted to a connector 55 on a printed circuit board 56 and mounted.

Figure 6:
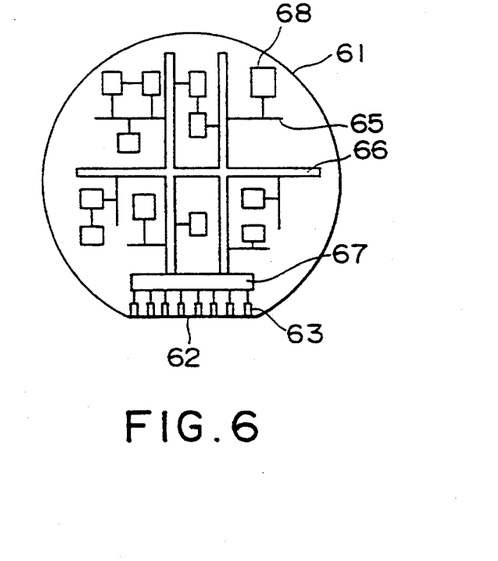
FIG. 6 is a plan view showing the arrangement of buses formed on a semiconductor wafer of the semiconductor device.

FIG. 6 shows an example of a configuration in the case where semiconductor chip parts are mounted on a semiconductor wafer and connected by bus lines. Semiconductor chips 68 are mounted on a semiconductor wafer 61, and input/output chips 67 are mounted at a location close to terminals 63 of a flat, oriented portion 62. On the surface of the semiconductor wafer 61, bus lines are formed so that signals can be transmitted between chips. The bus lines are formed with a characteristic impedance being 50 ohms in order to reduce the loss during signal transmission, and further are composed of main bus lines 66 and branch bus Lines 65 so that signal processing can be carried out efficiently. The main bus lines 66 extend in mainstay form on the surface of the semiconductor wafer 61, and the branch bus lines 65 are arranged in a branched state to the main bus lines 66. The semiconductor chip parts 68 are connected to the branch bus lines 65. On the other hand, the main bus lines 66 are connected through the input/output chips 67 to the terminals 63.

Figure 7:
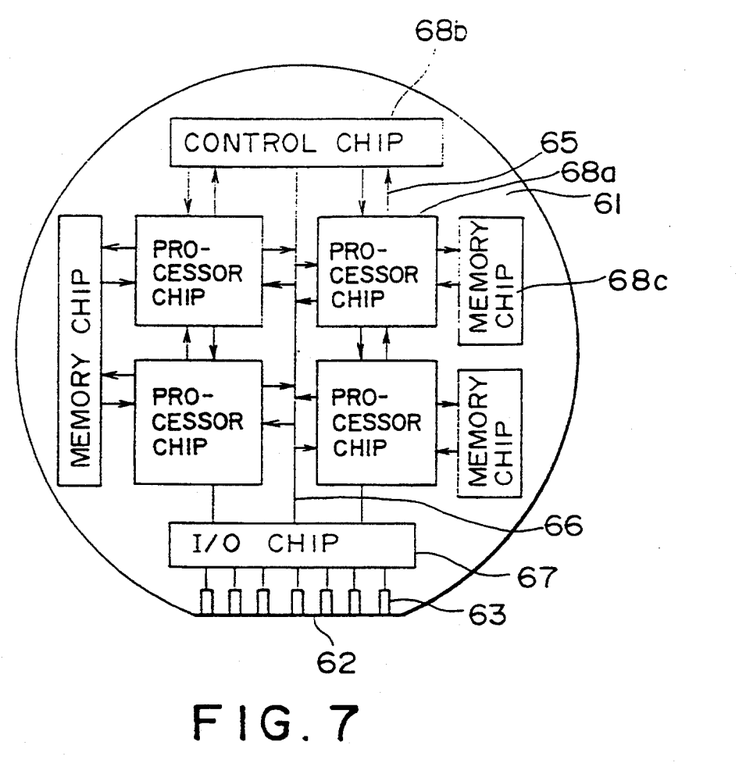
FIG. 7 is a plan view showing the arrangement of semiconductor chips mounted on a semiconductor wafer of the semiconductor device.

FIG. 7 shows an example where the semiconductor chips 68 are arranged on the semiconductor wafer 61. A logic operation chip 68a is arranged in the vicinity of the main bus line 66, and a control chip 68b and a memory chip 68c are arranged on the periphery of the semiconductor wafer 61. The logic operation chip 68a specifically includes chips of a register arithmetic logic operation unit (RALU), a sequence control unit (SQCU), an instruction memory unit (IROU) or a data memory unit (DRAU). Thus chips are arranged corresponding to respective functions so the delay of signals can be effectively suppressed.

Figures 8A, 8B:
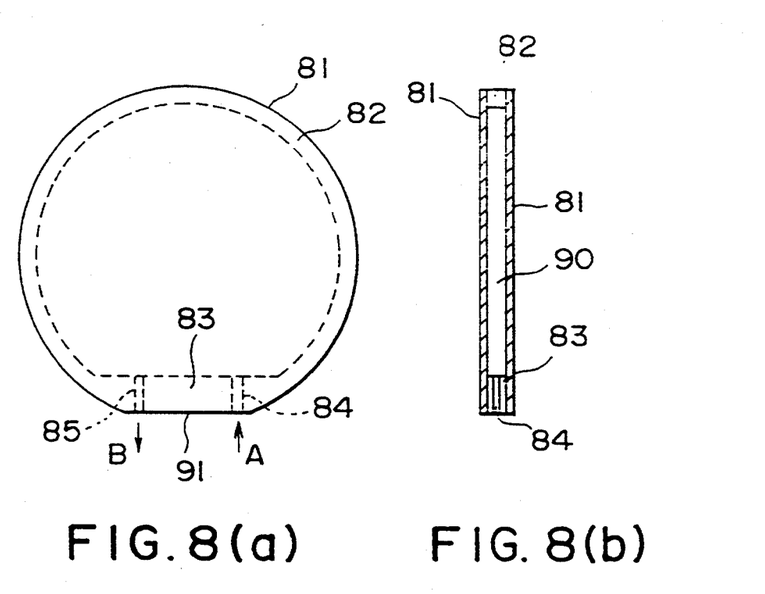
FIG. 8 provides a front view and a side view showing the structure of a semiconductor device according to a fourth embodiment of the invention.

Next, a fourth embodiment will be described where forced cooling is carried out so as to improve the radiation property. The structure of a device according to this embodiment is shown in FIG. 8(a) being a plan view and FIG. 8(b) being a right side view corresponding to this. Two semiconductor wafers 81 are joined in the state that a space 90 is internally formed through a spacer 82. When the semiconductor chip is to be mounted on the semiconductor wafer 81, it is mounted on the outside surface. The spacer 82 is provided with a cooling medium inlet/outlet member 83 having an inlet port 84 and an outlet port 85 for cooling medium at a flat, oriented portion 91 of the semiconductor wafer 81. A cooling medium flows in from the inlet port 84 in direction of the arrow A and fills the space 90, thereby cooling the semiconductor wafer 81. The cooling medium with its temperature raised by the heat discharged by the semiconductor wafer 81 flows from the outlet port 85 in the direction of arrow B.

Figure 9:
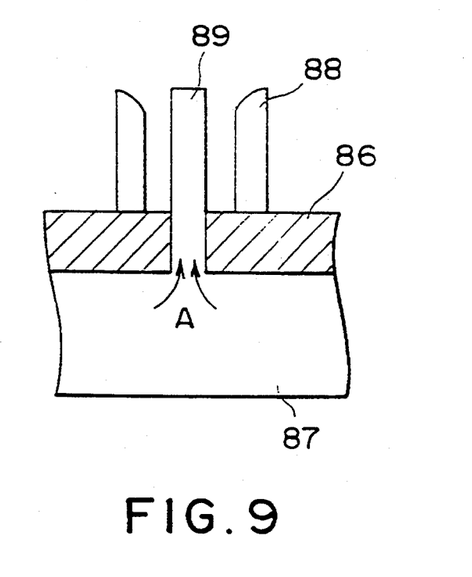
FIG. 9 is a longitudinal sectional view showing the structure of a printed circuit board of the semiconductor device.

Flowing-in or flowing-out of the cooling medium to the space 90 becomes possible by packaging on a printed circuit board 86 having structure as shown in FIG. 9. A connector 88 to be fitted to the orientation flat portion 91 of the two semiconductor wafers 81 is mounted on the printed circuit board 86. The connector 88 is provided with two pipes 89 to be fitted to the inlet port 84 and the outlet port 85 respectively at the center portion. The cooling medium flows in from one pipe 89 in the direction of arrow A into the space 90, and flows out from the space 90 through other pipe 89 (not shown) into piping 87 installed in parallel to the surface of the printed circuit board 86. Thus the cooling medium is circulated through the inside of the space 90 enclosed by the two semiconductor wafers 81 and the piping 87, whereby forced cooling is performed.

For the cooling medium, gas such as air, helium (He), or a liquid such a fluorocarbon being a compound of fluorine and carbon, a water can be used. In the device in the prior art as shown in FIG. 13, the radiation property is poor, and one semiconductor wafer is not allowed to consume power of 100 W or more. On the contrary, when the forced cooling structure as in the fourth embodiment is used, power consumption of 200 W or more becomes possible.

Figure 10:
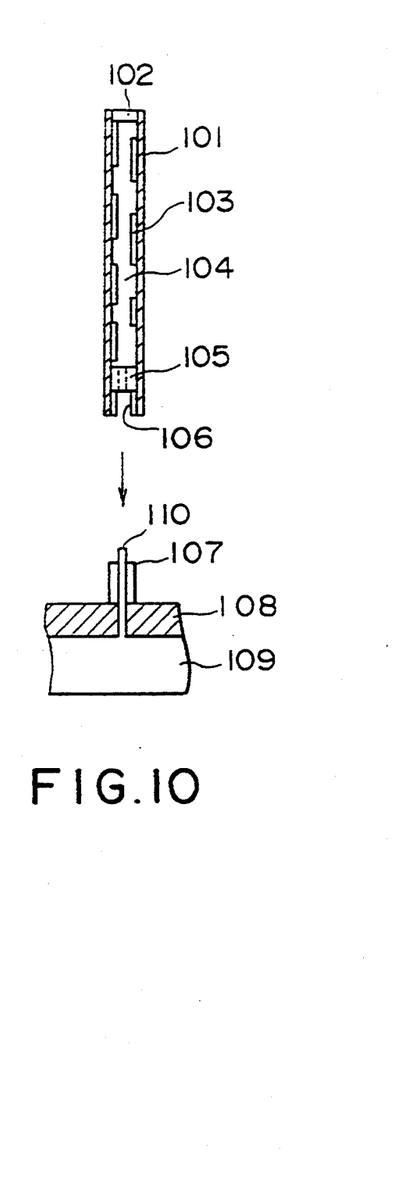
FIG. 10 is a side view showing the structure of a semiconductor device according to a fifth embodiment of the invention.

In a fifth embodiment of the present invention shown in FIG. 10, semiconductor chips 103 are mounted within a space 104 between two semiconductor wafers 101 joined by a spacer 102. Since each element package surface of the semiconductor wafer 101 is in an opposed state and is enclosed within the space 104, the cooling medium cools the semiconductor chips 103 directly, thereby increasing the cooling effect. In this embodiment, terminals 106 of the semiconductor wafer 101 are also installed to be opposed on the inside. The terminals 106 are contacted with both sides of a connector 107 installed on a printed circuit board 108 and are connected electrically. The cooling medium is circulated through a pipe 110 between piping 109 and the space 104 in a similar manner to the fourth embodiment.

Figure 11:
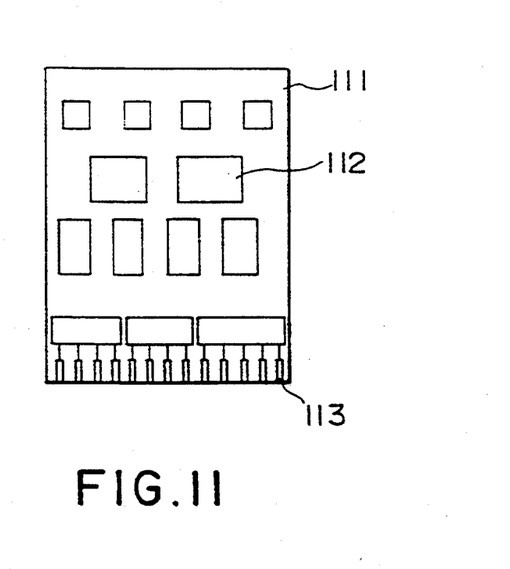
FIG. 11 is a side view showing the structure of a semiconductor device according to a sixth embodiment of the invention.

In any of the first to fifth embodiments as above described, a circular semiconductor wafer is used. However, as in a sixth embodiment shown in FIG. 11, a semiconductor wafer 111 worked into a rectangular shape may be used. In this case, when semiconductor chips 112 are mounted on the surface, wasteful space is eliminated at the periphery and thereby the mounting density is improved. Also in such a semiconductor wafer 111, terminals 113 are installed on the end surface thereby the wafer 111 can be mounted vertically on the printed circuit board.

Figure 12:
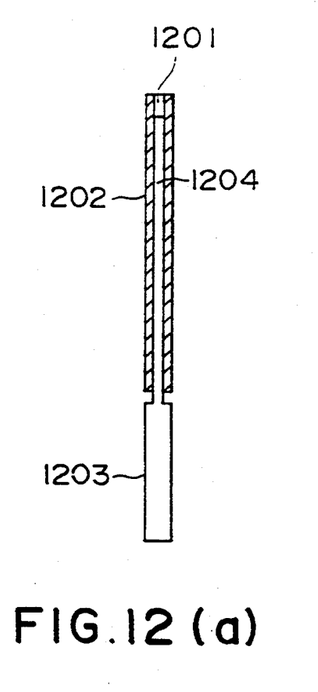
FIG. 12 provides a front view and a side view showing the structure of a semiconductor device according to a seventh embodiment of the invention.

Next, the structure of a seventh embodiment of the present invention is shown in FIG. 12(b) being a front view and FIG. 12(a) being a right side view thereof. This embodiment is characterized in that heat pipes are used in order to increase the radiation property. Two semiconductor wafers 1202 worked into rectangular shape are opposed with a spacer 1201, and in the space part, a plurality of heat pipes 1204 are inserted in a contacting state. A radiation fin 1203 is provided at the bottom end of each heat pipe 1204. The heat generated by the semiconductor wafers 1202 is transmitted through the heat pipes 1204 to the radiation fins 1203, and is radiated from the radiation fins 1203 whereby air cooling or liquid cooling is carried out. Since the heat pipes with a high heat transfer rate are used, the heat radiation property can be increased.

Each of the above-mentioned embodiments is an example, and does not limit the present invention. Also on portions of the surface of the semiconductor wafer and not having parts such as semiconductor chips packaged, a reinforcing plate of stainless steel or the like may be installed so as to increase the strength of the structure.

What is claimed is:

1. A semiconductor device comprising:
   a semiconductor wafer member constituted by two opposed semiconductor wafers with terminals installed at peripheral portions thereof and joined by an intercalated spacer with inlet/outlet ports such that a closed space is internally formed and a cooling medium flows in and out of said space;
   a printed circuit board having piping through which a cooling medium flows; and
   a connector installed on said printed circuit board and fitted to the inlet/outlet ports of said spacer and the piping of said printed circuit board, said connector having pipes connecting between the spacer of said semiconductor wafer member and the piping of said printed circuit board and being fitted to the peripheral portion of said semiconductor wafer member,
   wherein a peripheral portion of said semiconductor wafer member is fitted to said connector such that said semiconductor wafer member is mounted vertically on said printed circuit board, and wherein said cooling medium flows in and out through the pipes of said connector and the inlet/outlet ports of said spacer, and between the piping of said printed circuit board and the closed space of said semiconductor wafer member.

2. The semiconductor device as set forth in claim 1, wherein semiconductor chips are mounted on said semiconductor wafers.

3. The semiconductor device as set forth in claim 1, wherein a circuit pattern is formed on each semiconductor wafer, including bus lines comprising main bus lines and branch bus lines, and said main bus lines are connected to said terminals through input/output chips mounted on said semiconductor wafers.

4. The semiconductor device as set forth in claim 1, wherein said semiconductor wafer member is provided with semiconductor chips mounted on inside surfaces of said two semiconductor wafers.

5. A semiconductor device comprising:

a semiconductor wafer member constituted by two semiconductor wafers with terminals installed at a peripheral portion and opposed through a spacer;

heat pipes inserted between said two semiconductor wafers for transmitting heat generated by said semiconductor wafers to ends of said pipes;

radiation fins installed on the ends of said heat pipes for radiating the heat transmitted; and a printed circuit board, wherein said semiconductor wafer member is mounted vertically on said printed circuit board, with said terminals electrically connected to a circuit pattern on said printed circuit board.

6. The semiconductor device as set forth in claim 5, wherein an outside shape of each semiconductor wafer is rectangular.

7. The semiconductor device as set forth in claim 5, wherein semiconductor chips are mounted on said semiconductor wafers.

8. The semiconductor device as set forth in claim 5, wherein a circuit pattern is formed on each semiconductor wafer, including bus lines comprising main bus lines and branch bus lines, and said main bus lines are connected to said terminals through input/output chips mounted on said semiconductor wafers.

9. A method of mounting a semiconductor wafer comprising the steps of:

joining two opposed semiconductor wafers with terminals installed at peripheral portions by intercalating between said semiconductor wafers a spacer with inlet/outlet ports for a cooling medium to flow in and out, said semiconductor wafers and spacer constituting a semiconductor wafer member having a closed space internally formed;

installing piping for said cooling medium to flow in a printed circuit board;

installing a connector onto said printed circuit board, said connector being fitted to said piping and said inlet/outlet ports of said spacer and having pipes connecting between the inside of said space of said semiconductor wafer member and said piping of said printed circuit board and being fitted to said peripheral portion of said semiconductor wafer; and fitting a peripheral portion of said semiconductor wafer member to said connector thereby mounting said semiconductor wafer member vertically on said printed circuit board, and further making said cooling medium flow in and out through said pipes of said connector and said inlet/outlet ports of said spacer, between said piping of said printed circuit board and said space of said semiconductor wafer member.

10. The method of mounting a semiconductor wafer as set forth in claim 9, further comprising the step of mounting semiconductor chips opposed on inside surfaces of said two semiconductor wafers.

11. A method of mounting a semiconductor wafer comprising the steps of:

joining two opposed semiconductor wafers with terminals installed at peripheral portions by intercalating a spacer between said semiconductor wafers, said semiconductor wafers and intercalated spacer constituting a semiconductor wafer member;

inserting heat pipes between said two semiconductor wafers, said heat pipes having ends with radiation fins for radiating heat generated by said semiconductor wafers; and electrically connecting said terminals to a circuit pattern on a printed circuit board and mounting said semiconductor wafers substantially vertically on said printed circuit board.

12. The method of mounting a semiconductor wafer as set forth in claim 11, wherein said semiconductor wafers have a rectangular outer shape.

13. The method of mounting a semiconductor wafer as set forth in claim 11, further comprising the step of installing a reinforcing plate on a domain constituted by surfaces of said semiconductor wafers not having parts packaged thereon.

* * * * *